United States Patent
Kim et al.

(10) Patent No.: US 12,277,377 B2
(45) Date of Patent: Apr. 15, 2025

(54) EFFICIENT SCHEDULING OF TASKS FOR RESOLUTION ENHANCEMENT TECHNIQUE OPERATIONS

(71) Applicant: Siemens Industry Software Inc., Plano, TX (US)

(72) Inventors: Soohong Austin Kim, Pleasanton, CA (US); Hien T. Vu, San Jose, CA (US)

(73) Assignee: Siemens Industry Software Inc., Plano, TX (US)

( * ) Notice: Subject to any disclaimer, the term of this patent is extended or adjusted under 35 U.S.C. 154(b) by 516 days.

(21) Appl. No.: 17/629,923

(22) PCT Filed: Aug. 21, 2019

(86) PCT No.: PCT/US2019/047394
§ 371 (c)(1),
(2) Date: Jan. 25, 2022

(87) PCT Pub. No.: WO2021/034321
PCT Pub. Date: Feb. 25, 2021

(65) Prior Publication Data
US 2022/0292249 A1    Sep. 15, 2022

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC .............................. G06F 30/398; G06F 30/392
USPC ........................................................ 716/100
See application file for complete search history.

(56) References Cited

U.S. PATENT DOCUMENTS

| | | | |
|---|---|---|---|
| 7,434,199 B2* | 10/2008 | Cobb | G03F 1/36 716/51 |
| 7,487,489 B2* | 2/2009 | Granik | G03F 1/36 716/51 |
| 7,712,068 B2* | 5/2010 | Ren | G06F 30/398 716/55 |

(Continued)

FOREIGN PATENT DOCUMENTS

| | | | | |
|---|---|---|---|---|
| CN | 109478013 A | 3/2019 | | |
| WO | WO-2012125409 A2 * | 9/2012 | ............. | G03F 7/705 |

OTHER PUBLICATIONS

PCT Search Report dated Jun. 17, 2020, for PCT Application No. PCT/US2019/047394, 11 pages.

*Primary Examiner* — Suresh Memula

(57) ABSTRACT

A system and method for scheduling optical proximity correction (OPC) or other resolution enhancement technique (RET) operations on a layout design is disclosed. A layout design is divided into a plurality of regions, such as a plurality of tiles. OPC is performed on the plurality of tiles in order to generate a modified layout design. Performing OPC on the plurality of tiles may be time consuming. In order to more efficiently distribute the processing of OPC, estimates of OPC processing times for the plurality of tiles is performed. The estimate of the OPC processing time for a respective tile may be based on one or both of analysis of: analysis of the respective tile; or analysis of tile(s) that neighbor the respective tile. Based on the estimates, tiles that have a longer estimated processing tile are scheduled before tiles that have a shorter estimated processing time, thereby potentially resulting in more efficient OPC processing.

20 Claims, 6 Drawing Sheets

(56) References Cited

U.S. PATENT DOCUMENTS

| | | | |
|---|---|---|---|
| 7,814,456 B2* | 10/2010 | Gupta | H01L 22/20 |
| | | | 716/55 |
| 2002/0152449 A1 | 10/2002 | Lin | |
| 2006/0143589 A1 | 6/2006 | Horng et al. | |
| 2006/0242618 A1 | 10/2006 | Wang et al. | |
| 2007/0101303 A1* | 5/2007 | Lien | G06F 30/398 |
| | | | 716/54 |
| 2008/0174756 A1* | 7/2008 | Granik | G03F 7/70441 |
| | | | 716/54 |
| 2008/0250374 A1 | 10/2008 | Lucas et al. | |
| 2009/0271759 A1* | 10/2009 | Torres Robles | G06F 30/39 |
| | | | 716/50 |
| 2011/0271238 A1* | 11/2011 | Mansfield | G03F 1/70 |
| | | | 716/55 |
| 2013/0198700 A1* | 8/2013 | Sakajiri | G03F 1/36 |
| | | | 716/53 |
| 2013/0239071 A1* | 9/2013 | Chang | G03F 1/36 |
| | | | 716/53 |
| 2014/0040848 A1 | 2/2014 | Endo et al. | |
| 2017/0270235 A1 | 9/2017 | Word et al. | |
| 2019/0155143 A1 | 5/2019 | Lippincott et al. | |
| 2019/0266311 A1* | 8/2019 | Abouelseoud | G06F 30/398 |

* cited by examiner

EFFICIENT SCHEDULING OF TASKS FOR RESOLUTION ENHANCEMENT TECHNIQUE OPERATIONS

FIELD

The present disclosure relates to the field of circuit design and manufacture, and specifically relates to resolution enhancement techniques, such as optical proximity correction (OPC) operations, for layout designs.

BACKGROUND

Electronic circuits, such as integrated microcircuits, are used in a variety of products, from automobiles to microwaves to personal computers. Designing and fabricating integrated circuit devices typically involves many steps, sometimes referred to as a "design flow." The particular steps of the design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

For example, a layout design may be derived from an electronic circuit design. The layout design may comprise an integrated circuit (IC) layout, an IC mask layout, or a mask design. In particular, the layout design may be a representation of an integrated circuit in terms of planar geometric shapes which correspond to the patterns of metal, oxide, or semiconductor layers that make up the components of the integrated circuit. The layout design can be one for a whole chip or a portion of a full-chip layout design.

For purposes of analysis, the layout design may be divided into regions or units of computation, which may be used interchangeably. The regions may be an array of rectangle or square regions. Alternatively, the regions may include different shapes. The size may be several micrometers (μm) or ten μm. These regions or units of computation may be referred to as tiles or windows. In practice, the number of tiles may number in the hundreds of thousands or even in the millions.

As designers and manufacturers continue to shrink the size of circuit components, the shapes reproduced on the substrate through photolithography become smaller and are placed closer together. This reduction in feature size and spacing increases the difficulty of faithfully reproducing the image intended by the layout design onto the substrate and can create flaws in the manufactured device. To address the problem, one or more resolution enhancement techniques are often employed to improve the resolution of the image that a photolithographic mask forms on the substrate during a photolithographic circuit manufacture process.

In this regard, the various tiles may be analyzed using various resolution enhancement techniques. One such resolution enhancement technique, "optical proximity correction" or "optical process correction" (OPC), seeks to compensate for light diffraction effects. When light illuminates a photolithographic mask, the transmitted light diffracts, with light from regions with higher special frequencies diffracting at higher angles. The resolution limits of the lens in a photolithographic system make the lens act effectively as a low-pass filter for the various spatial frequencies in the two-dimensional layout. This may lead to optical proximity effects such as a pull-back of line-ends from their desired position, corner rounding, and a bias between isolated and dense structures. The optical proximity correction adjusts the amplitude of the light transmitted through a lithographic mask by modifying the layout design data employed to create the photolithographic mask. For example, edges in the layout design may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved, reducing optical proximity effects. Thus, using OPC or other types of resolution enhancement technique to analyze the tiles, which may number in the millions, is very computationally expensive.

BRIEF DESCRIPTION OF THE DRAWINGS

The accompanying drawings, which are incorporated in and constitute a part of this specification, illustrate various aspects of the invention and together with the description, serve to explain its principles. Wherever convenient, the same reference numbers will be used throughout the drawings to refer to the same or like elements.

DETAILED DESCRIPTION OF EMBODIMENTS

General Considerations

Figure 1:
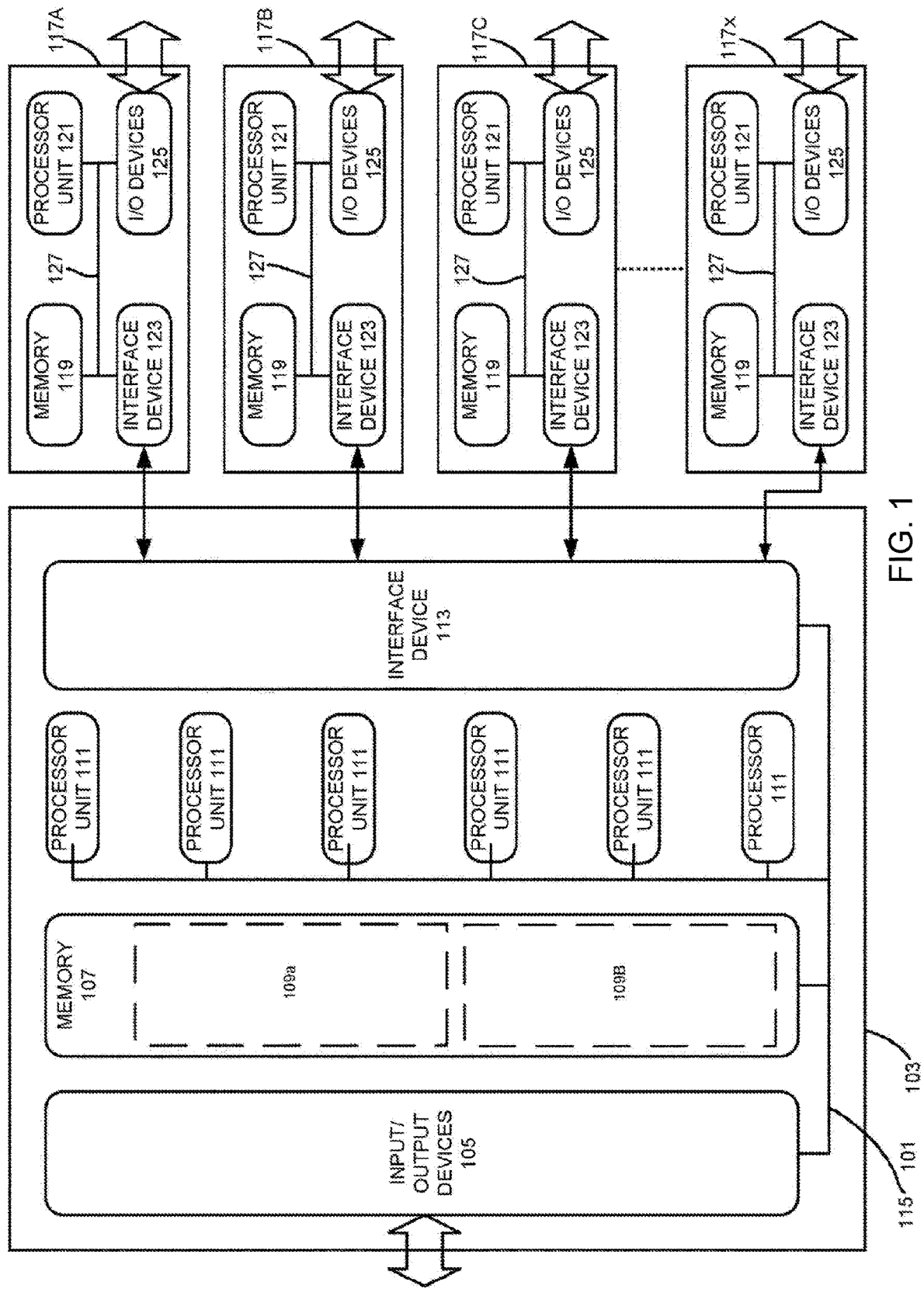
FIG. 1 illustrates an example of a computing system that may be used to implement various embodiments of the disclosed technology.

Various aspects of the present disclosed technology relate to techniques for scheduling resolution enhancement techniques (such as performing OPC operations) related to a semiconductor manufacturing process. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on one or more non-transitory computer-readable media, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "generate," "access," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input/output devices 105 and a memory 107. The input/output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations, such as the operations disclosed herein. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
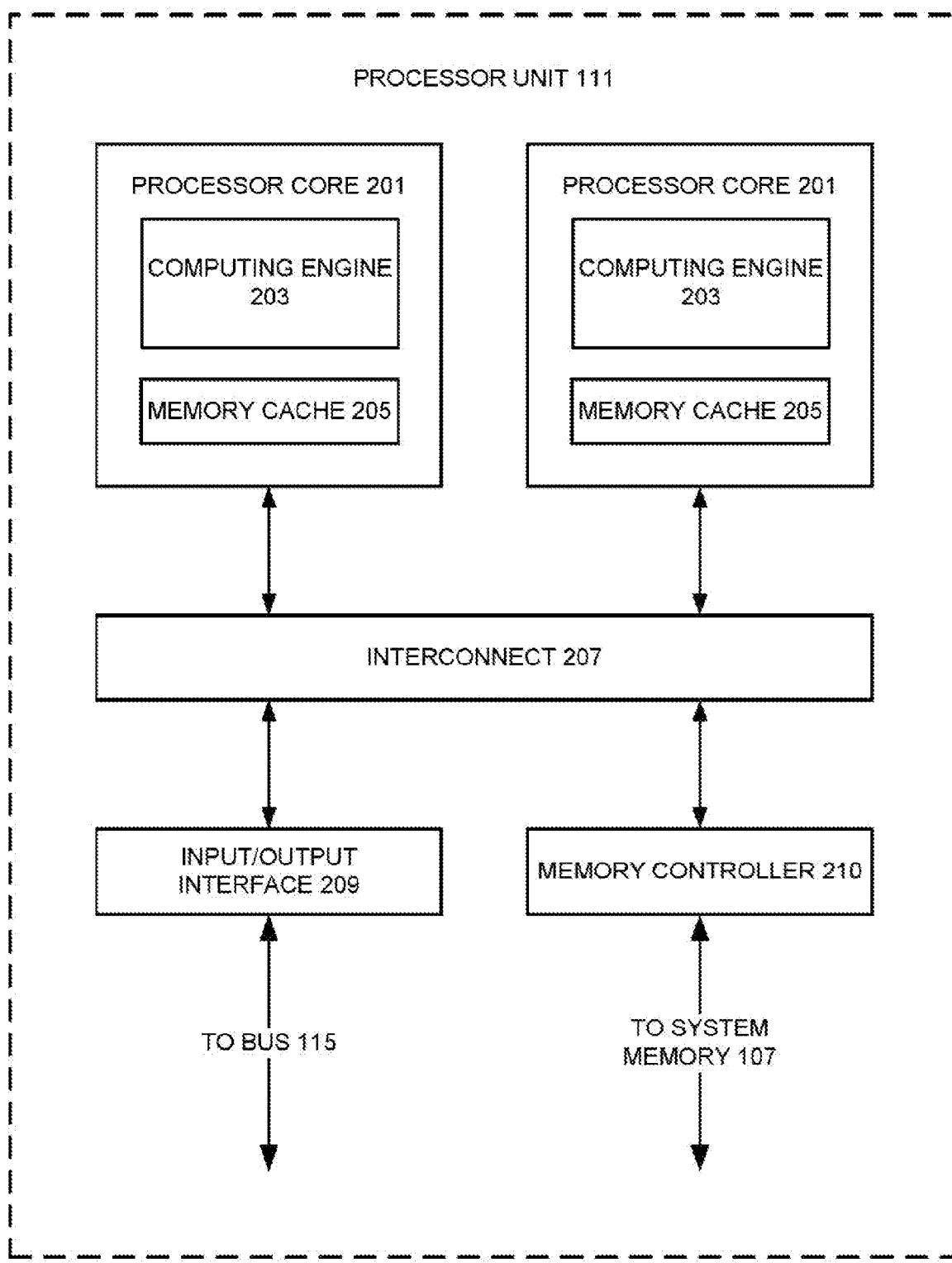
FIG. 2 illustrates an example of a multi-core processor unit that may be used to implement various embodiments of the disclosed technology.

With some implementations of the disclosed technology, the master computer 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design Flow and OPC

As discussed above, software and hardware tools verify the design at various stages of the design flow by running software simulators and/or hardware emulators. Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, automated place and route tools will be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, shapes in the layer representation of a metal layer will define the locations of the metal wires used to connect the circuit devices. Custom layout editors, such as Mentor Graphics' ICStation or Cadence's Virtuoso, allow a designer to custom design the layout, which is mainly used for analog, mixed-signal, RF, and standard-cell designs.

Integrated circuit layout descriptions may be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design may be used by fabrication tools to manufacture the device using a photolithographic process.

Typically, a designer will perform a number of verification processes on the layout design. For example, the layout design may be analyzed to confirm that it accurately represents the circuit devices and their relationships described in the device design. In this process, a layout versus schematic (LVS) tool extracts a netlist from the layout design and compares it with the netlist taken from the circuit schematic. LVS can be augmented by formal equivalence checking, which checks whether two circuits perform exactly the same function without demanding isomorphism.

The layout design also may be analyzed to confirm that it complies with various design requirements, such as minimum spacings between geometric elements and minimum linewidths of geometric elements. In this process, a design rule checking (DRC) tool takes as input a layout design in the GDSII standard format and a list of rules specific to the semiconductor process chosen for fabrication. A set of rules for a particular process is referred to as a run-set, rule deck, or just a deck. An example of the format of a rule deck is the Standard Verification Rule Format (SVRF) by Mentor Graphics Corporation.

There are many different fabrication processes for manufacturing a circuit, but most processes include a series of steps that deposit layers of different materials on a substrate, expose specific portions of each layer to radiation, and then etch the exposed (or non-exposed) portions of the layer away. Merely by way of example, a simple semiconductor device component could be manufactured by the following steps. First, a positive type epitaxial layer is grown on a silicon substrate through chemical vapor deposition. Next, a nitride layer is deposited over the epitaxial layer. Then, specific areas of the nitride layer are exposed to radiation, and the exposed areas are etched away, leaving behind exposed areas on the epitaxial layer, (i.e., areas no longer covered by the nitride layer). The exposed areas are then subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask is created to expose only the desired areas to the radiation, and to protect the other areas from exposure. The mask is created from circuit layout data. That is, the geometric elements described in a layout design define the relative locations or areas of the circuit that will be exposed to radiation through the mask. A mask or reticle writing tool is used to create the mask based upon the layout design, after which the mask can be used in a photolithographic process.

As discussed previously, one or more resolution enhancement techniques (RETs) may be employed to improve the resolution of the image that the mask forms on the substrate during the photolithographic process. One of these techniques is OPC, which can be rule-based, model-based, or both. In rule-based OPC, the proximity effects are characterized and specific solutions are devised for specific geometric configurations. The layout design is then searched using a DRC tool or a geometric-based software engine to find these geometric configurations. Once they are found, the specific solutions are applied.

RETs, other than OPC, are contemplated herein. In this regard, any discussion regarding OPC may be consistently applied to other RETs.

Rule-based OPC approaches work well for simple cases. For complex layout features, however, model-based OPC approaches are employed to obtain desired results. Model-based OPC performs simulation to predict the printed image, which guides layout modifications. In this regard, OPC may include both performing simulations to predict the printed image and performing any corrections or changes as warranted based on the simulations performed, as discussed further below. In a typical model-based OPC process, polygons in the layout design are divided into edge fragments to allow the desired fine motion of edge fragments. An example of this is illustrated in US Patent Application Publication No. 2019/0155143 A1, incorporated by reference herein in its entirety.

In particular, the size of the edge fragments and which particular edges are to be fragmented in a given layout design depends upon the OPC process parameters, often referred to as the OPC recipe. Simulation is performed to obtain the predicted printed image for the layout feature. This simulated image may be compared to the target image (such as compared at each edge fragment). The distances between the target image and the simulated image are often referred to as edge placement error (EPE). Next, the edge fragments may be individually moved or adjusted in order to enable the simulated image for the resulting mask to reproduce the target image as much as possible. Thereafter, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error.

The movement value for each edge fragment, often referred to as edge adjustment values or edge displacement values, may be the edge placement error multiplied by a constant factor (feedback factor). This feedback factor may be location dependent or edge type dependent based on the OPC recipe. Methods that consider correlations between neighboring edge fragments may also be employed to derive the movement value (referred to as cross-MEEF (mask error enhancement factor)-based methods).

The OPC iteration process continues until the simulated image is sufficiently similar to the target image, or until it is determined that the displacements of the edge fragments already have converged on locations where no further movement of the edge fragments will improve the simulated image. Once the final positions of the edge fragments are determined in the layout design data, a modified mask feature can be created from the corrected layout design data.

OPC Scheduling

OPC or other RET tasks for a layout design may be processed in a distributed fashion with multiple computer processing units (e.g., CPU cores as illustrated in FIGS. 1-2). Specifically, the tasks may be partitioned into many independent subtasks. As such, the overall utilization of the computing resources taken to process the whole task may depend on how the subtasks, each potentially taking different amount of times to complete, are scheduled both in sequencing and distribution of subtasks to the available cores. Thus, a layout design may be divided into a plurality of M regions (e.g., M tiles), with M subtasks corresponding to OPC or other RET simulation associated with the M regions, which may be processed in a distributed fashion across the multiple computer processing units.

As an extreme example, if there are N cores when M subtasks are to be performed by the N cores, where M>>N, assuming that each subtask takes an identical amount of time T, it would take ceil(M/N)*T units of time. Even with a perfectly parallelizable problem, the remainder M modulus N (M mod N, or M % N in C language expression) will determine the utilization of computing resources during an execution tail (also referred to simply as a tail). If M % N is 0, there is 100% utilization, where all subtasks complete at the same time and processing capability for none of the cores is wasted. On the other hand, if M % N is 1, there will be just one core being used to process the last subtask while N−1 cores are idling, waiting for the only remaining subtask to complete. If T and N are large, the waste can be significant. To further complicate the given example, consider that each of the M subtasks does not take the same amount of time. Depending on which subtask is executed first, the span of the tail (e.g., the time of less than 100% utilization at the end of the simulation process) may vary significantly.

In practice, OPC and other RET operations may involve simulation of semiconductor manufacturing process of geometric features with a certain set of models (e.g., optical and resist models). OPC operations may additionally involve iterative modification of the geometries involved to produce "corrected" results. As discussed above, these are typically done by partitioning the entire chip area into an order of millions of small regions called tiles, where typically tens of minutes to an hour or two may be spent on a single tile on a computing cluster comprising (or consisting of) a few hundred up to tens of thousands of cores. Therefore, in the light of the aforementioned scheduling problem, the unutilized resource in the execution tail of an OPC operation may be significant.

In the context of scheduling the M subtasks, one or more types of scheduling may improve core utilization. As one example, scheduling may be based on the estimated time (e.g., a relative estimated time and/or an actual estimated time) of completion of a respective subtask. In particular, scheduling in longest-running-subtask-first order (e.g., tasks with longer relative time estimates to perform the simulation are performed before tasks with shorter relative time estimates to perform the simulation) may result in an improved or an optimal result in terms of core utilization if the amount of computation times for each subtask is known a priori. In this regard, the estimated time of completion of the respective subtask may be used to rank the subtasks (e.g., rank the M subtasks), with the ranking being used in turn to schedule performing the M subtasks. This is in contrast to scheduling the M subtasks randomly and independently of any estimated completion time.

In certain embodiments, estimates for performing OPC or other RET operations on one, some, or all of the M subtasks are generated. The estimate for a respective subtask (e.g., for performing OPC on a specific tile) may be based on one or both of: analysis of the specific tile itself (e.g. analysis of one or more aspects of the specific tile in order to determine a relative time estimate to perform the respective subtask for the specific tile); and/or analysis of tiles that neighbor, border or are proximate to the specific tile (e.g., analysis of processing times of the neighboring tiles in order to estimate the time to perform the respective subtask for the specific tile). As discussed in more detail below, the estimate may comprise a time estimate of the specific tile relative to other tiles, which may be used to rank the specific tile amongst the other tiles.

The analysis of the respective subtask (e.g., the analysis of the specific tile) may estimate complexity to perform the respective subtask (e.g., the complexity of the layout design in the specific tile) in order to, in turn, estimate the relative time to perform the respective subtask (e.g., higher complexity of the layout design in the specific tile may correlate to a longer relative time to perform OPC or other RET operations on the specific tile). In turn, tiles with higher estimated complexity may be scheduled to undergo OPC or other RET operations before tiles with lower estimated complexity. One or more factors may be probative to estimate the complexity to perform the respective subtask.

Example factors include any one or both of: location of the specific tile; or layout design within the specific tile.

For example, the location of the specific tile may be relative to a predetermined location such as the geometric center of the layout design or a closest edge of the layout design. In particular, empirically, the layout design toward its center may tend to be more complex than at its edges. Thus, one indicator of complexity of the specific tile (and in turn its relative OPC processing time) may be its location, such as its location relative to the geometric center of the layout design or a nearest edge. The indicator of location may comprise an absolute position or a difference between the location of the tile and a predetermined location (e.g., the geometric center of the layout design or a nearest edge).

As another example, analysis of the layout design within the specific tile may likewise be probative of its complexity, and, in turn, the relative time necessary to perform OPC or other RET operations on the layout design within the specific tile. One or more types of analysis may be performed for the respective tile to determine the respective tile's complexity including one or both of: (1) counting a certain metric within the specific tile; or (2) analyzing shapes within the specific tile.

Various metrics may be counted, including the number of vertices in the layout design within the specific tile. For example, one tile with a higher number of vertices within its region may be indicative of a greater estimated density or complexity than another tile whose layout design includes a lower number of vertices. In this regard, the number of vertices may be indicative of density within the specific tile, and thus complexity. Other metrics indicative of density (separate from vertex density) are contemplated. For example, short edges (e.g., edges that are less than a predetermined length) may be counted within a respective tile to indicate short edge density within the respective tile. In turn, the short edge density may be used to determine relative processing time (e.g., higher short edge density is correlated to longer processing times versus lower short edge density). Though density may not strictly be monotonically correlated to the time required to process the specific tile, the density may nonetheless be probative of the relative time required to process the specific tile.

Further, various types of analysis of the shapes within the specific tile are contemplated. In some embodiments, the analysis may comprise identifying certain types of shapes, with the identified shapes being indicative of complexity or lack thereof within the specific tile. For example, certain shapes may be more difficult to print, resulting in a longer OPC processing time. In this regard, identifying the certain shapes within the specific tile that are more difficult to print may be probative to the estimated time for OPC processing. Alternatively, or in addition, the analysis may comprise identifying shapes in relation to other shapes, such as identifying distances between shapes within the specific tile (e.g., closeness of one shape to another). For example, the analysis may identify a critical distance between the shapes or subfeatures within the specific tile. OPC operations may involve moving one or more shapes within the specific tile while maintaining at least a certain predetermined distance between the shapes or subfeatures. Smaller distances between shapes or subfeatures may complicate OPC operations (including complicating the movability of shapes or subfeatures), and in turn may result in longer times to perform the OPC operations.

Alternatively, or in addition, tiles that neighbor, border or are proximate to a specific tile may be analyzed in order to estimate the time for OPC or other RET operations for the specific tile. As one example, one or more attributes associated with tile(s) that neighbor, border or are proximate to the specific tile may be analyzed in order to estimate the time for OPC or other RET operations for the specific tile. In particular, any one or both of the following attributes may be used: (1) actual processing time for OPC or other RET operations for the tile(s) that neighbor, border or are proximate to the specific tile; or (2) complexity of the tile(s) that neighbor, border or are proximate to the specific tile.

Processing of a layout design may be performed in stages, with certain tiles being processed before other tiles. As merely one example, tiles may have a category designation (e.g., "1", "2", "3", "4") with the sequence of OPC or other RET processing being performed based on the category designation (e.g., in a neighborhood, tiles designated as "1" are processed first; thereafter tiles in the neighborhood designated as "2" are processed; etc.). Given that one or more tiles neighboring, bordering, or proximate to the specific tile have already been processed, the processing time for the one or more tiles neighboring, bordering, or proximate to the specific tile may be probative to estimating the processing time for the specific tile. In one instance, the specific tile may be designated as "2", meaning that one or more tiles bordering the specific tile that are designated as "1" will be processed prior to processing the specific tile. The processing time(s) for the tile(s) designated as "1" bordering the specific tile may thus be used to estimate the processing time for the specific tile. In another instance, the specific tile may be designated as "3", meaning that one or more tiles bordering the specific tile that are designated as "1" and designated as "2" will be processed prior to processing the specific tile. The respective processing time(s) for the tile(s) designated as "1" and designated as "2" bordering the specific tile may thus be used to estimate the processing time for the specific tile designated as "3". In still another instance, the specific tile may be designated as "4", meaning that one or more tiles bordering the specific tile that are designated as "1", designated as "2", and designated as "3" will be processed prior to processing the specific tile. So that, the respective processing time(s) for the tile(s) designated as "1", designated as "2", and designated as "3" bordering the specific tile may thus be used to estimate the processing time for the specific tile designated as "4". In this way, the estimation of the processing time may be iterative based on different categories of tiles having already been processed.

Further, as discussed above, one or more factors may be used to estimate the complexity of a respective tile. Thus, the estimated complexity of neighboring, bordering, or proximate tiles to the specific tile may likewise be used to estimate the processing time for the specific tile.

Figure 3A:
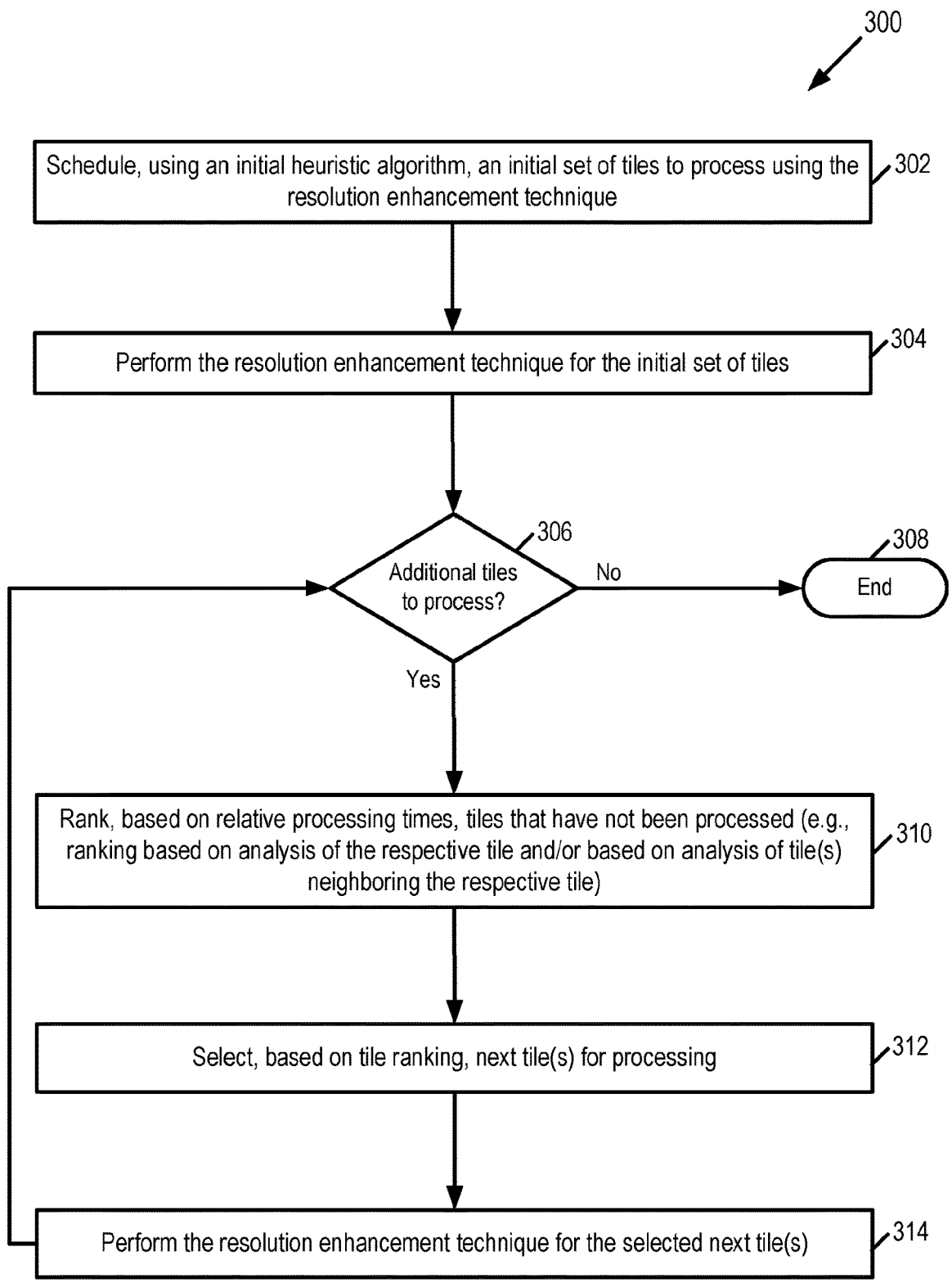
FIG. 3A illustrates a flow chart for scheduling and performing a resolution enhancement technique for a plurality of tiles in the layout design.

Referring back to the figures, FIG. 3A illustrates a flow chart 300 for scheduling and performing a resolution enhancement technique for a plurality of tiles in the layout design. As discussed above, the system may include N cores to process M tiles, where M>>N. Thus, at 302, the system scheduled, using an initial heuristic algorithm, an initial set of tiles (e.g., N tiles for the N cores) for processing using the resolution enhancement technique. As one example, the initial heuristic algorithm may randomly select the initial set of tiles from the entire set of tiles subject to processing. As another example, the initial heuristic algorithm may select the initial set of tiles based on the category designation (e.g., based on whether the tile is designated as a "1"). After which, at 304, the resolution enhancement technique is performed on the initial set of tiles.

At 306, it is determined whether there are additional tiles to process. If not, flow chart 300 ends at 308. If there are additional tiles to process, at 310, some or all of the tiles that still need to be processed are ranked. As discussed above, ranking of a respective tile may be based on analysis of the respective tile itself. For example, the complexity of the respective tile may be used to rank the tile relative to the complexity of other tiles that still need to be processed. Alternatively, or in addition, ranking of the respective tile may be based on analysis of neighboring tiles. For example, tiles neighboring the respective tile may have already been processed. The processing times for the neighboring tiles may be averaged (e.g., a neighboring average) so that the respective tile may be ranked, relative to the neighboring average of other tiles.

At 312, the next tile(s) for processing are selected based on tile ranking. For example, the tiles may be ranked from longest to shortest estimated processing time, with the tiles having the longest estimated processing time selected (such as selecting the N highest ranked tiles for processing by the N cores). At 314, the resolution enhancement technique is performed for the selected next tile(s). After which, flow chart 300 loops back to 306. In this way, the scheduling of processing of the tiles may be dynamic. Specifically, the scheduling priority may be reevaluated periodically, with the highest priority tiles selected for processing next.

Figure 3B:
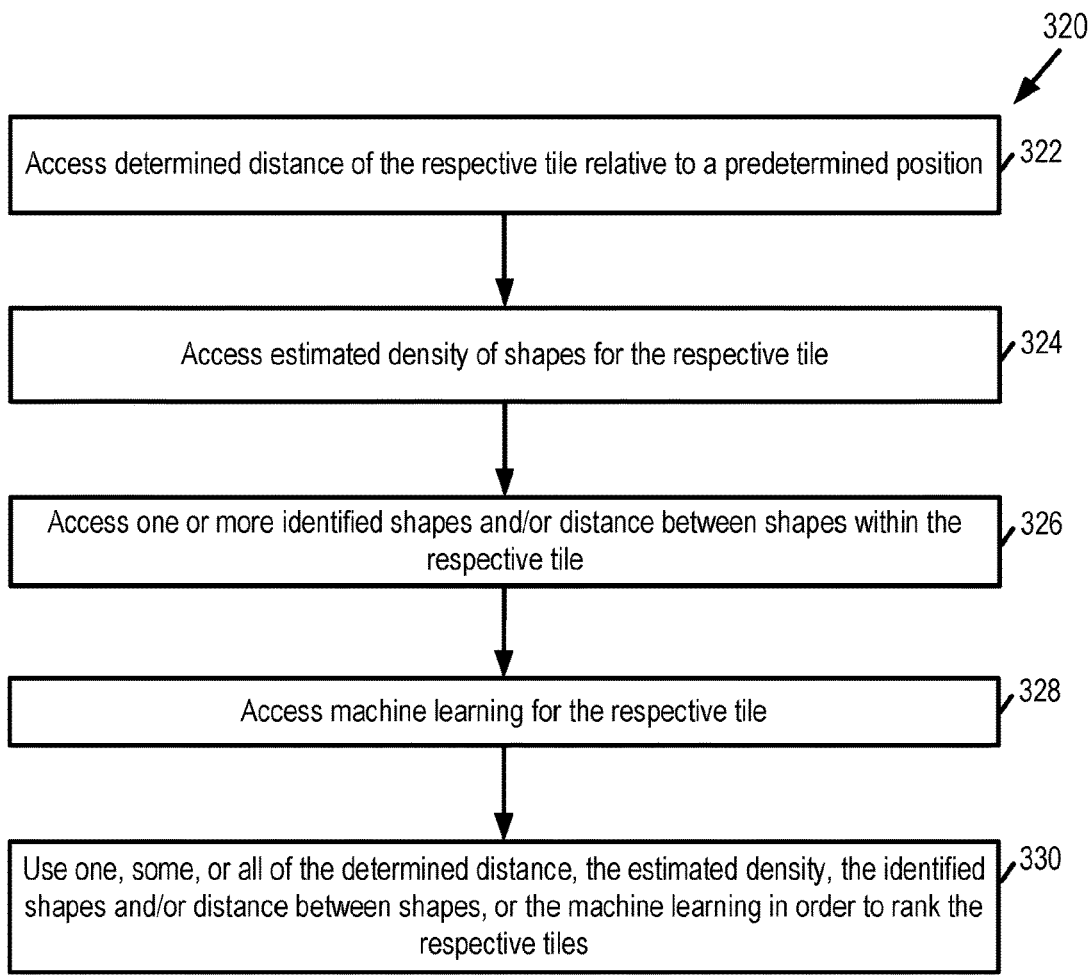
FIG. 3B illustrates a flow chart for ranking tiles based on analysis of the tiles in order to schedule performing a resolution enhancement technique on the tiles.

FIG. 3B illustrates a flow chart 320 for estimating relative processing times for tiles in the layout design based on analysis of the respective tile. As discussed above, various factors may be considered in ranking the processing time of tiles including any one, any combination, or all of: position of the tile in the layout; density of shapes in the tile; identified shapes and/or distance between shapes; or machine learning used to analyze complexity of the tile. Thus, at 322, the determined distance of the respective tile relative to a predetermined position (such as to a geometric center of the layout design or to a closest edge of the layout design) is accessed. In particular, a respective tile's positioning closer to a geometric center/farther from an edge of the layout design may indicate a more complex layout within the respective tile (and thus an increased estimated simulation time) whereas a respective tile's positioning farther from a geometric center/closer to an edge of the layout design may indicate a less complex layout within the respective tile (and thus an estimated simulation time with a lesser value as compared to a more complex layout).

As another example, density of certain geometric attributes (e.g., corner vertices clustered close to each other) of the layout device within the respective tile may be used to rank relative processing times, with a higher density being correlated, such as directly or indirectly correlated, to a longer estimated simulation time. In particular, at 324, an estimate of the density of shapes for the respective tile is accessed.

As still another example, specific identified shapes and/or distance between shapes may indicate complexity in the respective tile, and in turn a higher simulation processing time. Thus, at 326, one or more identified shapes and/or distance between shapes within the respective tile may be accessed.

As still another example, machine learning may be used to determine complexity for a respective tile. Thus, at 328, machine learning may be accessed to generate an output indicative of the complexity of the respective tile. Generally speaking, machine learning builds a mathematical model based on training data in order to make predictions. Presently, machine learning may use training data in order to train a mathematical model that is configured to output an estimated simulation time. Various inputs to the machine learning are contemplated, such as any one, any combination, or all of the factors disclosed herein, including: the section of the layout design associated with the respective tile; the location of the respective tile; the estimated density within the respective tile; or the identified shapes and/or the distance between shapes within the respective tile. Other factors are contemplated. The machine learning may likewise output an indicator of complexity of the respective tile, which may be used for ranking the respective tile relative to other tiles, as discussed further below. Further, various types of machine learning are contemplated, including: supervised learning; unsupervised learning; reinforcement learning; or feature learning.

At 330, the respective tiles are ranked relative to one another in order to schedule RET processing of the tiles. The ranking may be based on one, some, or all of: the determined distance; the estimated density; the identified shapes and/or distance between shapes; or the machine learning. As one example, the tiles may be organized in separate rankings for each of the determined distance ranking (e.g., further away from the center results in a lower ranking), the estimated density ranking (e.g., lower density results in lower ranking), the identified shapes and/or distance between shapes ranking (e.g., certain identified shapes or closer distance between the identified shapes results in a higher ranking), and the machine learning ranking (e.g., the machine learning model outputs the ranking) The rankings may then be combined (e.g., averaged or weighted) in order to generate an overall ranking of the tiles. In particular, a specific tile may have the following rankings: determined distance ranking: #5,005; estimated density ranking: #2,101; identified shapes and/or distance between shapes: #902; machine learning ranking: #1,404, resulting in an averaged ranking of #2,353, which may be used for selection of the specific tile for processing. As another example, the tiles may be ranked based on only one of the determined distance, the estimated density, the identified shapes and/or distance between shapes, and the machine learning. In this way, the tiles may be ranked based on relative processing times, such as the highest ranking being based on the longest relative estimate. In turn, the ranking may be used for determining scheduling/execution priority for the tiles.

Figure 3C:
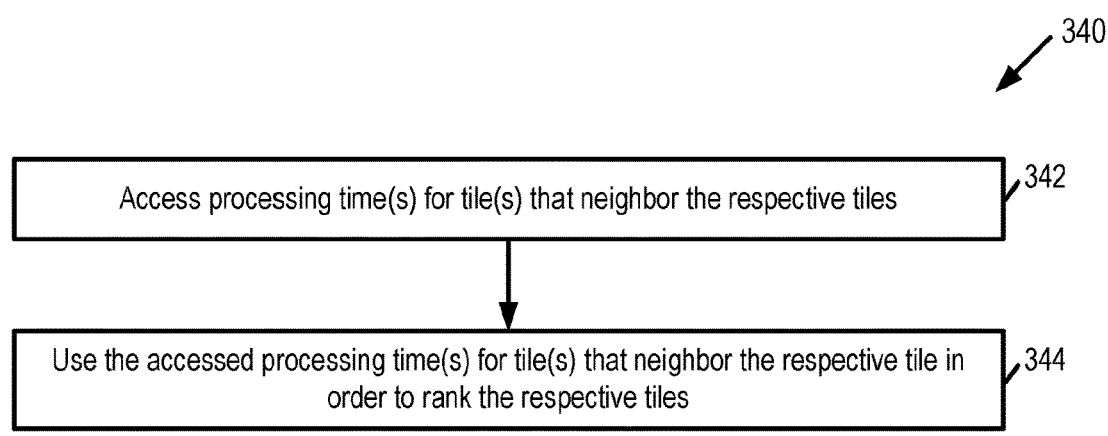
FIG. 3C illustrates a flow chart for ranking tiles based on analysis of neighboring tiles in order to schedule performing a resolution enhancement technique on the tiles.

FIG. 3C illustrates a flow chart 340 for ranking tiles based on analysis of neighboring tiles in order to schedule performing a resolution enhancement technique on the tiles. As discussed above, one or more aspects associated with tile(s) that neighbor the respective tile may be used in order to rank the respective tile relative to other tiles. Various aspects are contemplated including one or both of: any part or all of the analysis disclosed in FIG. 3B; or actual processing time(s) for the tile(s) that neighbor the respective tile and that have already undergone processing. Thus, at 342, the processing time(s) for one or more tiles that neighbor the respective tile and that have already undergone processing are accessed. As discussed above, a tile may neighbor the respective tile if the tile borders, touches, or is proximate to the respective tile (e.g., is an adjacent tile, is within 1 tile of the respective tile, etc.). At 344, the accessed simulation time(s) for tile(s) that neighbor respective tiles are used to rank the respective tiles. In the example discussed above where tiles have a category designation (e.g., "1", "2", "3", "4"), the category designated associated with the respective tile may first be accessed. Thereafter, simulation times for tiles that neighbor the respective tile with a certain designation (e.g., a number lower than the respective tile's designation) may be accessed. One, some or all of the accessed simulation times for the tiles may then be used in order to determine the estimated simulation time for the respective tile. As discussed below with regard to FIGS. 4-5, the accessed simulation times may be mathematically combined in order to generate the estimated simulation time for the respective tile. Examples of mathematical combination including, but are not limited to: normalizing; weighting; averaging; or the like. Further, other mathematical combinations of the accessed simulation times are contemplated. For example, in a specific neighborhood, tiles designated as "1" are processed before tiles designated as "2". In ranking the "2" tiles in the specific neighborhood, the processing times for tiles designated as "1" that are in the neighborhood of a tile designated as "2" may be used to rank the tiles designated as "2", as discussed further below.

Figure 4:
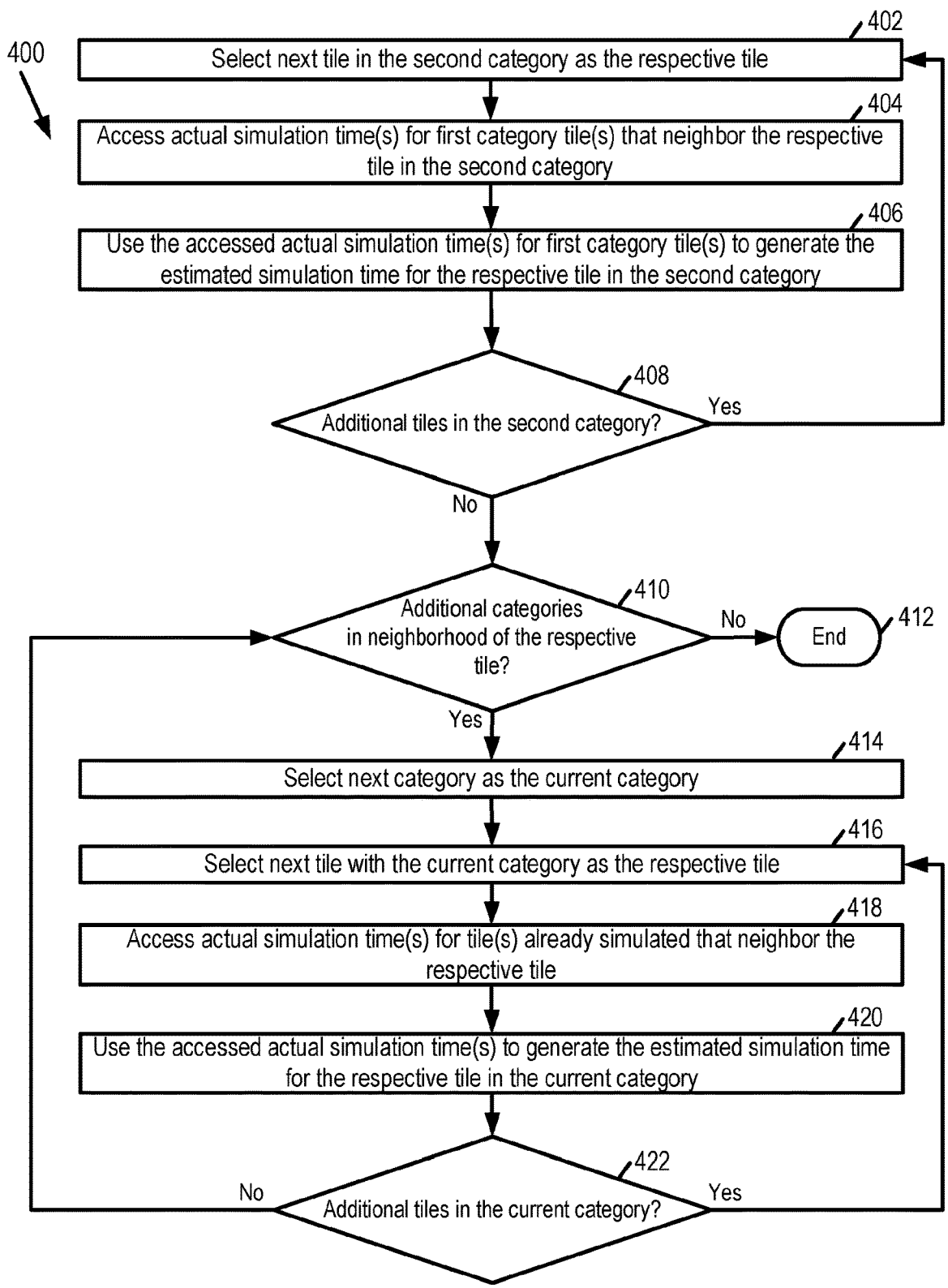
FIG. 4 illustrates a flow chart for iteratively estimating a processing time for a respective tile based on the actual processing times for the tiles in the neighborhood of the respective tile.
Figure 5:
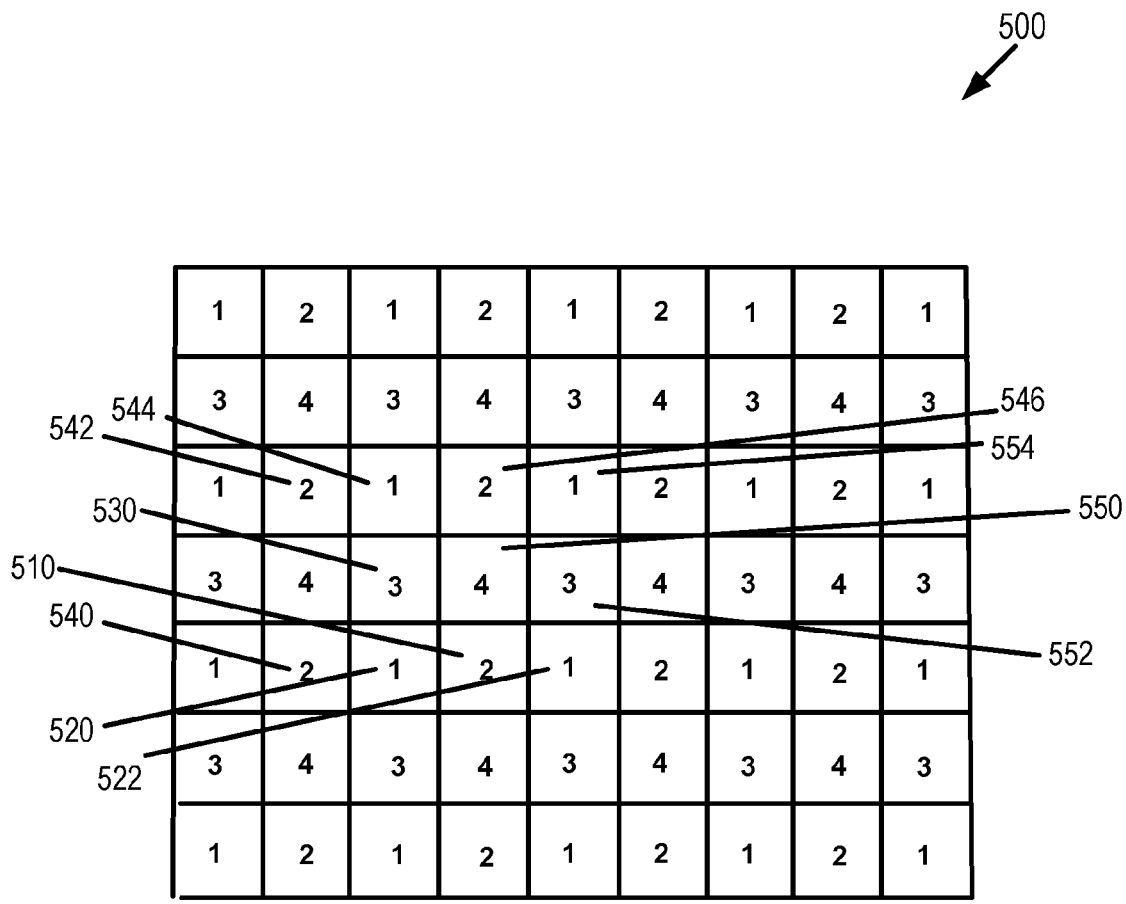
FIG. 5 illustrates an example layout for tile coloring using OPC.

FIG. 4 illustrates a flow chart 400 for iteratively ranking estimated times for tiles based on the actual simulation times for the tiles in the neighborhood of the tiles. FIG. 5 illustrates an example layout 500 for tile coloring using OPC, with the tile coloring having designations of "1", "2", "3", "4". Though FIG. 5 illustrates tiles designated as "1", "2", "3", "4", other designations are contemplated. In this regard, different sequences of processing tiles are likewise contemplated.

At 402, a respective tile in the second category is selected. As discussed above, tiles may be assigned a category, such as designated as "1" for a first category and designated as "2" for a second category. As one example, the respective tile may be at 510, as shown in FIG. 5. At 404, the actual simulation time(s) for first category tiles that neighbor the respective tile in the second category may be accessed. For example, the simulation times for one or both of the tile "1" at 520, 522 may be accessed. At 406, the accessed actual simulation time(s) for first category tile(s) are used to generate the estimated simulation time for the respective tile in the second category. As one example, the simulation times for both of the tile "1" at 520, 522 may be averaged. As another example, the simulation times for both of the tile "1" at 520, 522 may be unevenly weighted (e.g., the tile "1" (at 522) closer to the geometric center may be weighted greater than the tile "1" (at 520) further from the geometric center, or vice versa).

At 408, it is determined whether there are other tiles in the second category. If so, flow chart 400 loops back to 402 to select the next tile in the category as the respective tile. If not, flow chart loops to 410, where it is determined whether there are additional categories in the neighborhood of the respective tile. If no, flow chart 400 ends at 412. If so (e.g., if there are tiles of category "3" or "4"), flow chart 400 moves to 414. At 414, the next category is selected as the current category. For example, the next category may be tiles designated as "3", such as tile 530. At 416, a tile with the current category may be selected as the respective tile. At 418, simulation time(s) for tile(s) in the neighborhood of the respective tile are accessed. For example, the simulation times for one or both of tile "1" at 520, 544 may be accessed and the simulation times for one, some or all of tile "2" at 510, 540, 542, 546 may be accessed. At 420, the accessed simulation time(s) are used to generate the estimated simulation time for the respective tile. As one example, all of the accessed simulation times may be averaged. As another example, the accessed simulation times may be weighted, such as weighted based on an amount that the neighboring tile borders the respective tile. As shown in FIG. 5, tile 530 has tiles 510, 520, 540, 542, 544, and 546 that border tile 530 and where the simulations have already been performed.

Further, as shown in FIG. 5, tiles designated as "1" 520, 544 share a common side with tile 530 whereas tiles designated as "2" 510, 540, 542, and 546 share a common corner. In this regard, tiles designated as "1" 520, 544 share more of a common perimeter than tiles designated as "2" 510, 540, 542, and 546. Thus, in one implementation, the accessed simulation times for tiles that share a larger common perimeter may be weighted higher that the accessed simulation times for tiles that share less common area. Similar to estimate the simulation of a tile with a designation of "3", estimation of a tile with a designation of "4" (such as tile 550) may likewise be performed by using the simulation times of neighboring tiles, such as tiles designated as "1" at 520, 522, 544, 554, tiles designated as "2" at 510, 546, and tiles designated as "3" at 530, 552.

At 422, it is determined whether there are other tiles in the current category. If so, flow chart 400 loops back to 416 to select the next tile in the category as the respective tile. If not, flow chart loops to 410, where it is determined whether there are additional categories in the neighborhood of the respective tile.

As described above, FIG. 5 illustrates designating tiles so that the tiles will be processed in 4 separate batches. any division of processing into two or more categories or batches (e.g., division of the tiles into 2, 3, 5 or more categories) may allow previous simulation times to be used to estimate later simulation times.

The following example embodiments of the invention are also disclosed:

Embodiment 1

A method, executed by at least one processor of a computer, comprising:
  receiving a layout design, the layout design being divided into regions;
  estimating respective times to perform a resolution enhancement technique (RET) for a plurality of the regions;
  scheduling the RET for the plurality of the regions based on the estimated respective times; and
  performing the RET for the plurality of the regions based on the scheduling.

Embodiment 2

The method of embodiment 1,
  wherein estimating the respective times to perform the RET for the plurality of the regions comprises ranking the plurality of the regions; and
  wherein scheduling the RET for the plurality of the regions is based on the rank of the plurality of the regions.

Embodiment 3

The method of any of embodiments 1 and 2,
  wherein regions with longer estimated respective times to perform the RET are scheduled before regions with shorter estimated respective times to perform the RET.

Embodiment 4

The method of any of embodiments 1-3,
  wherein the plurality of the regions comprises a plurality of tiles;

wherein a respective tile of the plurality of the tiles has a respective estimated time;
wherein the respective estimated time is based on estimated complexity associated with the respective tile; and
wherein tiles with higher estimated complexity are scheduled for processing before tiles with lower estimated complexity.

Embodiment 5

The method of any of embodiments 1-4,
wherein the plurality of the regions comprises a plurality of tiles; and
wherein the estimated complexity associated with a respective tile is based on a location of the respective tile within the layout design.

Embodiment 6

The method of any of embodiments 1-5,
wherein the estimated complexity is based on a difference between the location of the respective tile and a predetermined location within the layout design.

Embodiment 7

The method of any of embodiments 1-6,
wherein the predetermined location comprises a geometric center of the layout design.

Embodiment 8

The method of any of embodiments 1-6,
wherein the predetermined location comprises a closest edge of the layout design.

Embodiment 9

The method of any of embodiments 1-8,
wherein the estimated complexity associated with the respective tile is based on analysis of the layout design within the respective tile.

Embodiment 10

The method of any of embodiments 1-9,
wherein analysis of the respective tile comprises analysis of an estimated density of the layout design within the respective tile.

Embodiment 11

The method of any of embodiments 1-10,
wherein the analysis of the estimated density of the layout design within the respective tile comprises determining a number of vertices for the layout design within the respective tile; and
wherein a higher number of vertices determined for the layout design within the respective tile is indicative of a greater estimated density of the respective tile than another respective tile whose layout design includes a lower number of vertices.

Embodiment 12

The method of any of embodiments 1-11,
wherein the analysis of the estimated density of the layout design within the respective tile comprises analyzing one or more shapes of the layout design within the respective tile.

Embodiment 13

The method of any of embodiments 1-12,
wherein analyzing the one or more shapes of the layout design within the respective tile comprises analyzing closeness of the one or more shapes to each other for the layout design within the respective tile.

Embodiment 14

The method of any of embodiments 1-13,
wherein analyzing the one or more shapes of the layout design within the respective tile comprises analyzing movability of the one or more shapes for the layout design within the respective tile.

Embodiment 15

The method of any of embodiments 1-14,
wherein estimating the respective times to perform the RET for the plurality of the regions is based on machine learning.

Embodiment 16

The method of any of embodiments 1-15,
wherein the machine learning comprises:
identifying one or more shapes of the layout design within a respective region; and
using the machine learning, based on the identified one or more shapes of the layout design within the respective region, in order to determine an estimated time for performing the RET for the respective region.

Embodiment 17

The method of any of embodiments 1-16,
wherein estimating the time to perform RET for a respective region is based on analysis of one or more regions that neighbor the respective region.

Embodiment 18

The method of any of embodiments 1-17,
wherein the one or more regions that neighbor the respective region comprise regions that border the respective region.

Embodiment 19

The method of any of embodiments 1-18,
wherein performing the RET on the regions that border the respective region is performed before performing the RET on the respective region; and
wherein actual times for performing the RET for the regions that border the respective region are used to estimate the time to perform the RET for the respective region.

Embodiment 20

The method of any of embodiments 1-19,
wherein the actual times for the regions that border the respective region are normalized in order to estimate the time to perform the RET for the respective region.

Embodiment 21

The method of any of embodiments 1-20,
wherein the actual times for the regions that border the respective region are averaged in order to estimate the time to perform the RET for the respective region.

Embodiment 22

One or more non-transitory computer-readable media storing computer-executable instructions for causing one or more processors performance of a method according to any of embodiments 1-21.

Embodiment 23

A system, comprising: one or more processors, the one or more processors programmed to perform a method according to any of embodiments 1-21.

The above disclosed subject matter is to be considered illustrative, and not restrictive, and the appended claims are intended to cover all such modifications, enhancements, and other embodiments, which fall within the true spirit and scope of the description. Thus, to the maximum extent allowed by law, the scope is to be determined by the broadest permissible interpretation of the following claims and their equivalents, and shall not be restricted or limited by the foregoing detailed description.

The invention claimed is:

1. A method, executed by at least one processor of a computer, comprising:
receiving a layout design, the layout design divided into regions;
estimating respective times to perform a resolution enhancement technique (RET) for a plurality of the regions;
scheduling the RET for the plurality of the regions based on the estimated respective times,
wherein the plurality of the regions comprises a plurality of tiles,
wherein a respective tile of the plurality of the tiles has a respective estimated time;
wherein the respective estimated time is based on estimated complexity associated with the respective tile; and
wherein tiles with higher estimated complexity are scheduled for processing before tiles with lower estimated complexity; and
performing the RET for the plurality of the regions based on the scheduling.

2. The method of claim 1, wherein the estimated complexity associated with a respective tile is based on a location of the respective tile within the layout design.

3. The method of claim 2, wherein the estimated complexity is based on a difference between the location of the respective tile and a predetermined location within the layout design.

4. The method of claim 3, wherein the predetermined location comprises a geometric center of the layout design.

5. The method of claim 3, wherein the predetermined location comprises a closest edge of the layout design.

6. The method of claim 1, wherein estimating the respective times to perform the RET for the plurality of the regions is based on machine learning, including by:
identifying one or more shapes of the layout design within a respective region; and
using the machine learning, based on the identified one or more shapes of the layout design within the respective region, in order to determine an estimated time for performing the RET for the respective region.

7. The method of claim 1, wherein estimating the time to perform RET for a respective region is based on analysis of one or more regions that neighbor the respective region.

8. The method of claim 7, wherein the one or more regions that neighbor the respective region comprise regions that border the respective region.

9. The method of claim 8, wherein performing the RET on the regions that border the respective region is performed before performing the RET on the respective region; and
wherein actual times for performing the RET for the regions that border the respective region are used to estimate the time to perform the RET for the respective region.

10. One or more non-transitory computer-readable media storing computer-executable instructions, that when executed by one or more processors, cause a computing system to:
receive a layout design, the layout design divided into regions;
estimate respective times to perform a resolution enhancement technique (RET) for a plurality of the regions;
schedule the RET for the plurality of the regions based on the estimated respective times,
wherein the plurality of the regions comprises a plurality of tiles,
wherein a respective tile of the plurality of the tiles has a respective estimated time;
wherein the respective estimated time is based on estimated complexity associated with the respective tile; and
wherein tiles with higher estimated complexity are scheduled for processing before tiles with lower estimated complexity; and
perform the RET for the plurality of the regions based on the scheduling.

11. The one or more non-transitory computer-readable media of claim 10, wherein the estimated complexity associated with the respective tile is based on analysis of the layout design within the respective tile.

12. The one or more non-transitory computer-readable media of claim 11, wherein analysis of the respective tile comprises analysis of an estimated density of the layout design within the respective tile.

13. The one or more non-transitory computer-readable media of claim 12, wherein the analysis of the estimated density of the layout design within the respective tile comprises determining a number of vertices for the layout design within the respective tile; and
wherein a higher number of vertices determined for the layout design within the respective tile is indicative of a greater estimated density of the respective tile than another respective tile whose layout design includes a lower number of vertices.

14. The one or more non-transitory computer-readable media of claim 12, wherein the analysis of the estimated density of the layout design within the respective tile comprises analyzing one or more shapes of the layout design within the respective tile.

15. The one or more non-transitory computer-readable media of claim 14, wherein analyzing the one or more shapes of the layout design within the respective tile comprises analyzing closeness of the one or more shapes to each other for the layout design within the respective tile or analyzing movability of the one or more shapes for the layout design within the respective tile.

16. The one or more non-transitory computer-readable media of claim 10, wherein the computer-executable instructions cause the computing system to estimate the time to perform RET for a respective region based on analysis of one or more regions that neighbor the respective region, wherein the one or more regions that neighbor the respective region comprise regions that border the respective region;
wherein the computer-executable instructions cause the computing system to perform the RET on the regions that border the respective region before performing the RET on the respective region; and
wherein actual times for performing the RET for the regions that border the respective region are used to estimate the time to perform the RET for the respective region.

17. The one or more non-transitory computer-readable media of claim 16, wherein the computer-executable instructions cause the computing system to normalize the actual times for the regions that border the respective region in order to estimate the time to perform the RET for the respective region.

18. The one or more non-transitory computer-readable media of claim 16, wherein the computer-executable instructions cause the computing system to average the actual times for the regions that border the respective region in order to estimate the time to perform the RET for the respective region.

19. One or more non-transitory computer-readable media storing computer-executable instructions, that when executed by one or more processors, cause a computing system to:
receive a layout design, the layout design divided into regions;
estimate respective times to perform a resolution enhancement technique (RET) for a plurality of the regions, including by estimating a time to perform RET for a respective region based on analysis of one or more regions that neighbor the respective region;
schedule the RET for the plurality of the regions based on the estimated respective times; and
perform the RET for the plurality of the regions based on the scheduling.

20. The non-transitory computer-readable media of claim 19, wherein the one or more regions that neighbor the respective region comprise regions that border the respective region.

\* \* \* \* \*